(12) United States Patent
Singh et al.

(10) Patent No.: US 10,541,701 B1
(45) Date of Patent: Jan. 21, 2020

(54) ANALOG SIGNAL CONDITIONING

(71) Applicant: Cirrus Logic International Semiconductor Ltd., Edinburgh (GB)

(72) Inventors: Saurabh Singh, Cedar Park, TX (US);
Edmund Mark Schneider, Austin, TX (US); Eric Kimball, Austin, TX (US);
Daniel J. Allen, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/124,825

(22) Filed: Sep. 7, 2018

(51) Int. Cl.
*H03M 1/12* (2006.01)
*H03M 1/06* (2006.01)

(52) U.S. Cl.
CPC ....... *H03M 1/0629* (2013.01); *H03M 1/0614* (2013.01); *H03M 1/1245* (2013.01)

(58) Field of Classification Search
CPC .......................... H03M 1/0629; H03M 1/0614
USPC ........................................ 341/155, 122, 143
See application file for complete search history.

(56) References Cited

U.S. PATENT DOCUMENTS

| | | | | | |
|---|---|---|---|---|---|
| 4,872,127 | A | * | 10/1989 | Nolan | G06J 1/00 708/3 |
| 5,313,494 | A | * | 5/1994 | Park | H04L 25/03834 332/103 |
| 5,585,801 | A | * | 12/1996 | Thurston | H03M 3/366 341/143 |
| 9,853,666 | B1 | * | 12/2017 | Vareljian | H03G 5/005 |
| 2010/0085230 | A1 | * | 4/2010 | Son | H03M 3/344 341/155 |
| 2017/0317685 | A1 | * | 11/2017 | Gupta | H03M 3/376 |

* cited by examiner

*Primary Examiner* — Peguy Jean Pierre
(74) *Attorney, Agent, or Firm* — Jackson Walker L.L.P.

(57) ABSTRACT

An analog conditioning circuit and a corresponding method for processing an analog input signal provide a conditioned analog signal for input into an analog processing circuit. The analog conditioning circuit comprises a main signal path between an input for receiving the analog input signal and an output for outputting the conditioned analog signal, wherein the transfer function of the main signal path is constrained by a transfer function requirement associated with the analog processing circuit; and a feedforward signal path comprising a first filtering block configured to attenuate desired frequencies of a first signal derived from the analog input signal to provide a filtered analog signal; wherein the feedforward signal path is configured to input the filtered analog signal into the main signal path such that the filtered analog signal is subtracted from a second signal derived from the analog input signal to provide the conditioned analog signal.

21 Claims, 7 Drawing Sheets

ANALOG SIGNAL CONDITIONING

TECHNICAL FIELD

Embodiments described herein relate to methods and apparatus for processing an analog input signal to provide a conditioned analog signal for input into an analog processing circuit. In particular, embodiments described herein relate to the use of a feedforward signal path to process undesired frequencies of the input analog signal in order to avoid impacting the total harmonic distortion in a main signal path.

BACKGROUND

An anti-aliasing filter (AAF) is a filter used to restrict the bandwidth of an analog input signal before sampling the analog input signal in order to approximately or completely satisfy the sampling theorem over the frequency band of interest. In other words, the highest frequency of the analog input signal may be limited by the AAF to equal to or below half of the sampling frequency. An AAF is therefore effectively a lowpass filter which limits the highest frequency of the analog input signal.

Figure 1:
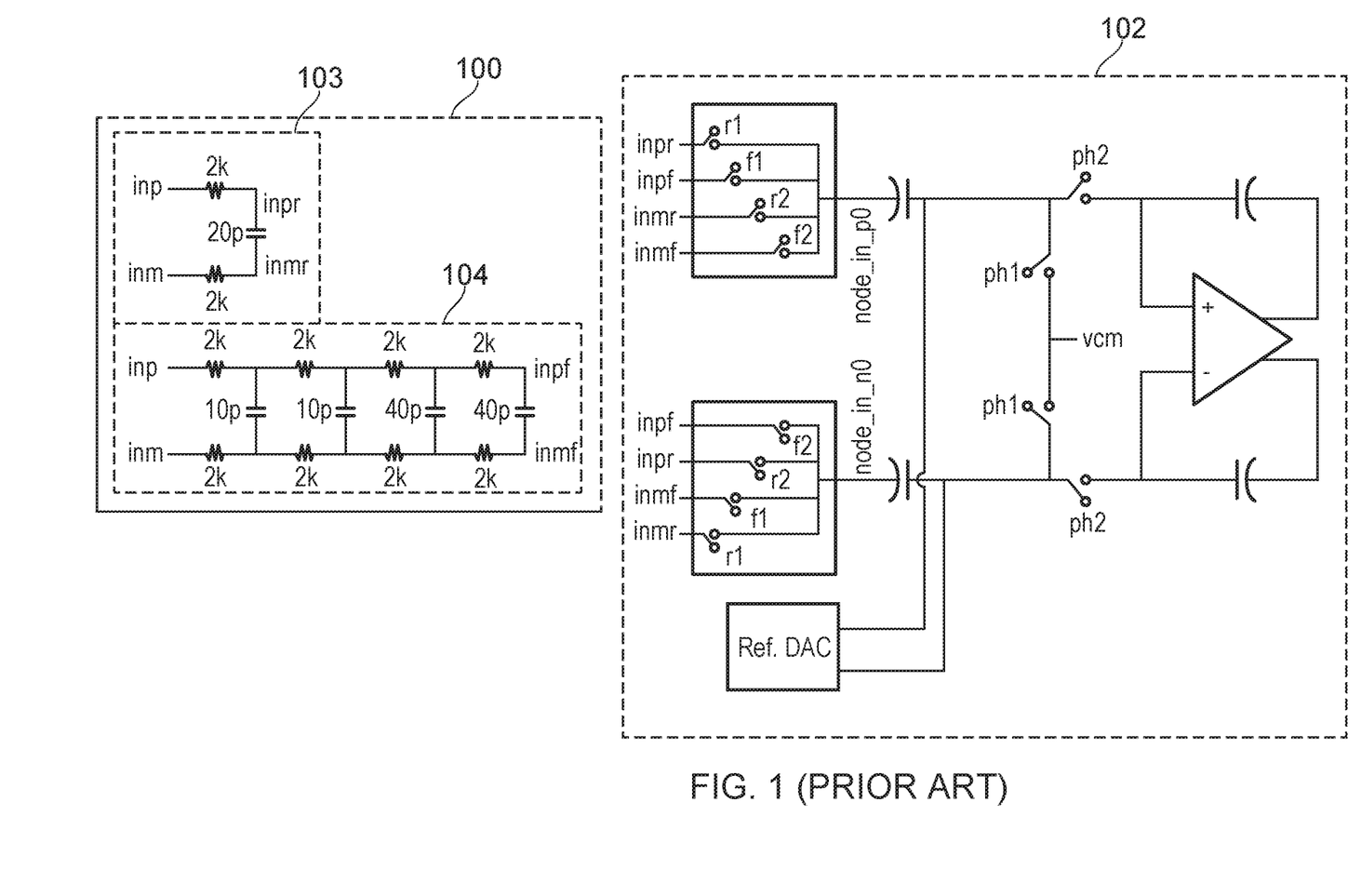
FIG. 1 is an example of an anti-aliasing filter, AAF in accordance with the prior art.

FIG. 1 illustrates an example of an AAF 100 providing a filtered signal for input into a double sampled ADC 102. It will be appreciated that the AAF 100 may be used to provide an input signal for any suitable type of analog processing circuitry. The AAF in this example comprises a rough low pass filter 103 and a fine low pass filter 104 which provide the two input signals for the rough and fine charging phases of the double sampled ADC 102.

However, ADC anti-aliasing requirements have become fairly stringent recently. This requirement may be challenging for ADCs that are directly connected to the AAFs without any programmable gain amplifiers (PGAs) or any active low pass filter.

In order to improve the anti-aliasing, the capacitance or the resistance in the AAF may be increased. However, increasing the resistance or impedance of the signal path leads to an impact on the total harmonic distortion and increasing the capacitance comes at a significant area cost.

Alternatively, an active low pass filter comprising a programmable gain amplifier (PGA) in the signal path may improve the anti-aliasing. However, the active LPF would also have to meet THD requirements associated with the signal path. Area and power concerns for such an active LPF may be of particular importance as the active LPF would be in the signal path.

SUMMARY

According to embodiments described herein, there is provided an analog conditioning circuit configured to process an analog input signal to provide a conditioned analog signal for input into an analog processing circuit. The analog conditioning circuit comprises a main signal path between an input for receiving the analog input signal and an output for outputting the conditioned analog signal, wherein the transfer function of the main signal path is constrained by a transfer function requirement associated with the analog processing circuit; and a feedforward signal path comprising a first filtering block configured to attenuate desired frequencies of a first signal derived from the analog input signal to provide a filtered analog signal; wherein the feedforward signal path is configured to input the filtered analog signal into the main signal path such that the filtered analog signal is subtracted from a second signal derived from the analog input signal to provide the conditioned analog signal.

According to some embodiments, there is provided a method for conditioning an analog input signal to provide a conditioned analog signal for input into an analog processing circuit. The method comprises filtering a first signal derived from the analog input signal to attenuate desired frequencies of the first signal to provide a filtered analog signal; and subtracting the filtered analog signal from a second signal derived from the analog input signal to provide the conditioned analog signal; wherein a transfer function between the analog input signal and the conditioned analog signal is constrained by a transfer function requirement associated with the analog processing circuit.

BRIEF DESCRIPTION OF THE DRAWINGS

For a better understanding of the embodiments of the present disclosure, and to show how it may be put into effect, reference will now be made, by way of example only, to the accompanying drawings, in which.

DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments disclosed herein use a feedforward path to process the undesired frequencies of an input analog signal before removing these undesired frequencies from a main analog signal path. The filtering that takes place in the feedforward path need not be constrained by the same total harmonic distortion (THD) requirements as the main analog signal path. Therefore, additional resistances can be used in the feedforward signal path to perform the filtering, resulting in more efficient anti-aliasing without affecting the THD of the main analog signal path.

Figure 2:
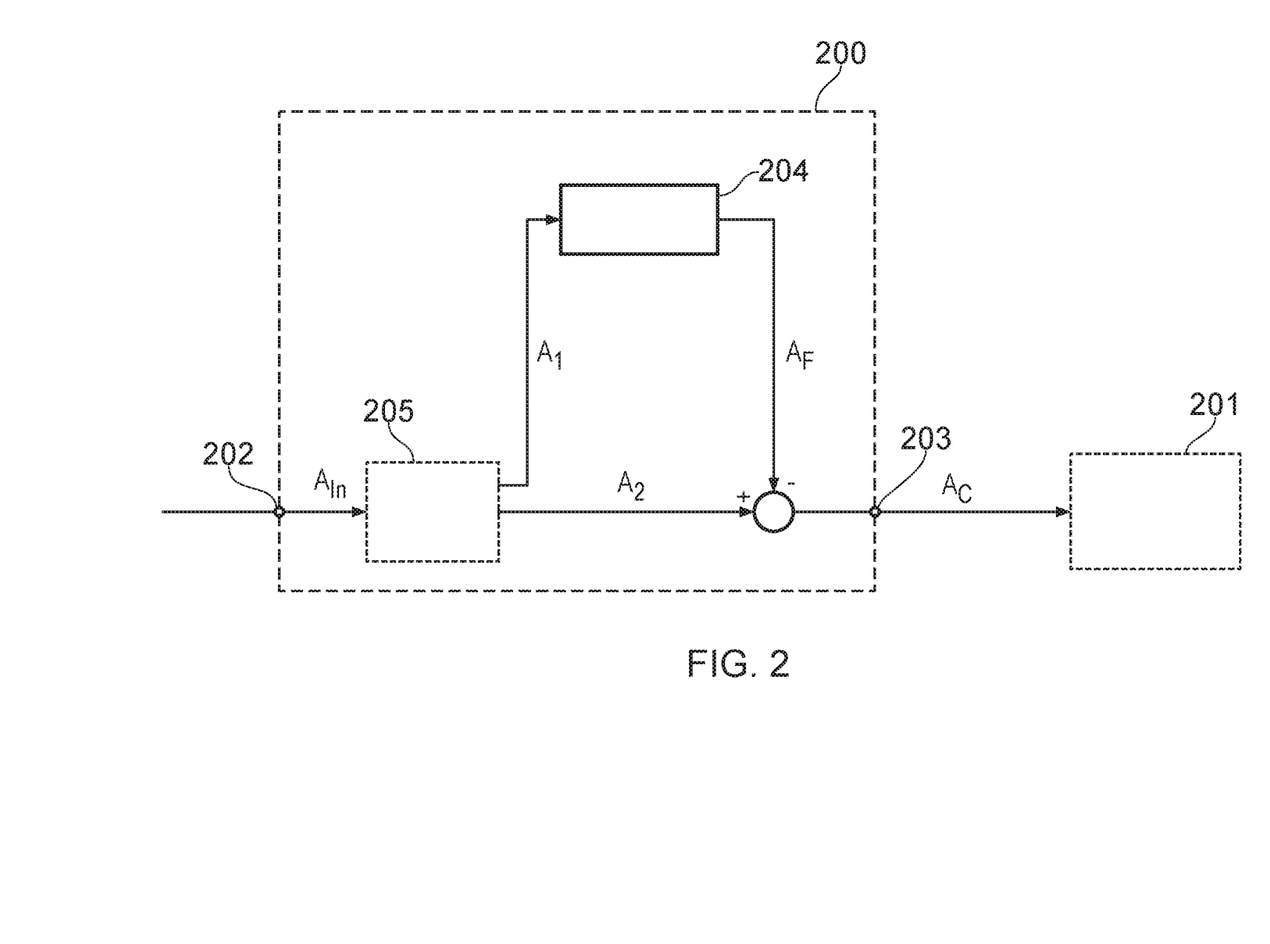
FIG. 2 illustrates an example of an analog conditioning circuit in accordance with embodiments of the present disclosure.

FIG. 2 illustrates an example of an analog conditioning circuit 200 according to some embodiments. The analog conditioning circuit 200 is configured to process an analog input signal $A_{In}$ to provide a conditioned analog signal $A_C$ for input into an analog processing circuit 201.

The analog conditioning circuit 200 comprises a main signal path between an input 202, for receiving the analog input signal $A_{In}$, and an output 203 for outputting the conditioned analog signal $A_C$, wherein a transfer function of the main signal path is constrained by a transfer function requirement associated with the analog processing circuit 201. For example, the transfer function of the main signal path may be required to be approximately linear with respect to the analog input signal $A_{In}$. In some examples, the transfer function requirement of the main signal path may comprise a maximum resistance associated with the main signal path, or a maximum total harmonic distortion (THD) level in the main signal path. THD in a signal path may be introduced by error terms in the transfer function of the signal path whose dependency on the analog input signal $A_{In}$ are non-linear.

For example, given a nonlinear output impedance to the analog processing circuit 201, for example an ADC, an increase in resistance in the main signal path may increase the total harmonic distortion of the main signal path due to interactions with the nonlinear output impedance of the analog processing circuitry 201.

The analog conditioning circuit 200, in this example, further comprises a feedforward signal path comprising a first filtering block 204 configured to attenuate desired frequencies of a first signal $A_1$ derived from the analog input signal $A_{In}$ to provide a filtered analog signal $A_F$.

The feedforward signal path is configured to input the filtered analog signal $A_F$ into the main signal path such that the filtered analog signal $A_F$ is subtracted from a second signal $A_2$ derived from the analog input signal $A_{In}$ to provide the conditioned analog signal $A_C$.

In some examples, for example, where the analog processing circuit 201 comprises an ADC (for example a switched capacitor ADC), the first filtering block 204 may comprise a high pass filter configured to attenuate the desired frequencies of the first signal $A_1$. In this example therefore, the desired frequencies may comprise the frequencies below half the sampling frequency of the ADC. In other words, the analog conditioning circuit 200 may be configured to provide anti-aliasing of the analog input signal $A_{In}$ in accordance with the sampling theorem.

The first filtering block 204 may comprise an active or a passive high pass filter. In particular, as the feedforward signal path is processing undesired frequencies (by suppressing the desired frequencies) and therefore does not affect the total harmonic distortion of the main signal path, an active high pass filter in the feedforward signal path may not have to meet the same THD requirements that may be required if an active low pass filter was used in the main signal path.

In some examples, the main signal path comprises a second filtering block 205 configured to attenuate undesired frequencies of the analog input signal $A_{In}$ to provide the second signal $A_2$. For example, the second filtering block 205 may comprise a low pass filter configured to attenuate the undesired high frequency signals of the analog input signal $A_{In}$ to provide the second signal $A_2$.

In some examples, the first signal $A_1$ may comprise the analog input signal $A_{In}$. In some examples, the second signal $A_2$ may comprise the analog input signal $A_{In}$, in other words, there may be no attenuation of the undesired frequencies in the main signal path.

In some examples, the first signal $A_1$ is also provided by the second filtering block 205 which is configured to attenuate undesired frequencies of the analog input signal $A_{In}$ to provide the first signal $A_1$. In some examples, the signals $A_1$ and $A_2$ are the same. However, in some examples, the second filtering block 205 comprises a first filter configured to attenuate undesired frequencies of the analog input signal $A_{In}$ to generate the first signal $A_1$; and a second filter configured to attenuate undesired frequencies of the analog input signal $A_{In}$ to generate a third signal $A_3$. In some examples, the second filtering block may further comprise a sampling block configured to sample the first signal $A_1$ and the third signal $A_3$ to generate the second signal $A_2$. An example of such a second filtering block 205 is illustrated in FIG. 3 below.

Therefore, in embodiments described herein, instead of altering the filtering in the main signal path to improve the anti-aliasing of the low pass filter in the second filtering block 205, a feedforward signal path is introduced which processes only the undesired frequencies, and then removes these undesired frequencies from the main signal path. The total harmonic distortion is therefore not substantially increased by the inclusion of the feedforward signal path.

Figure 3:
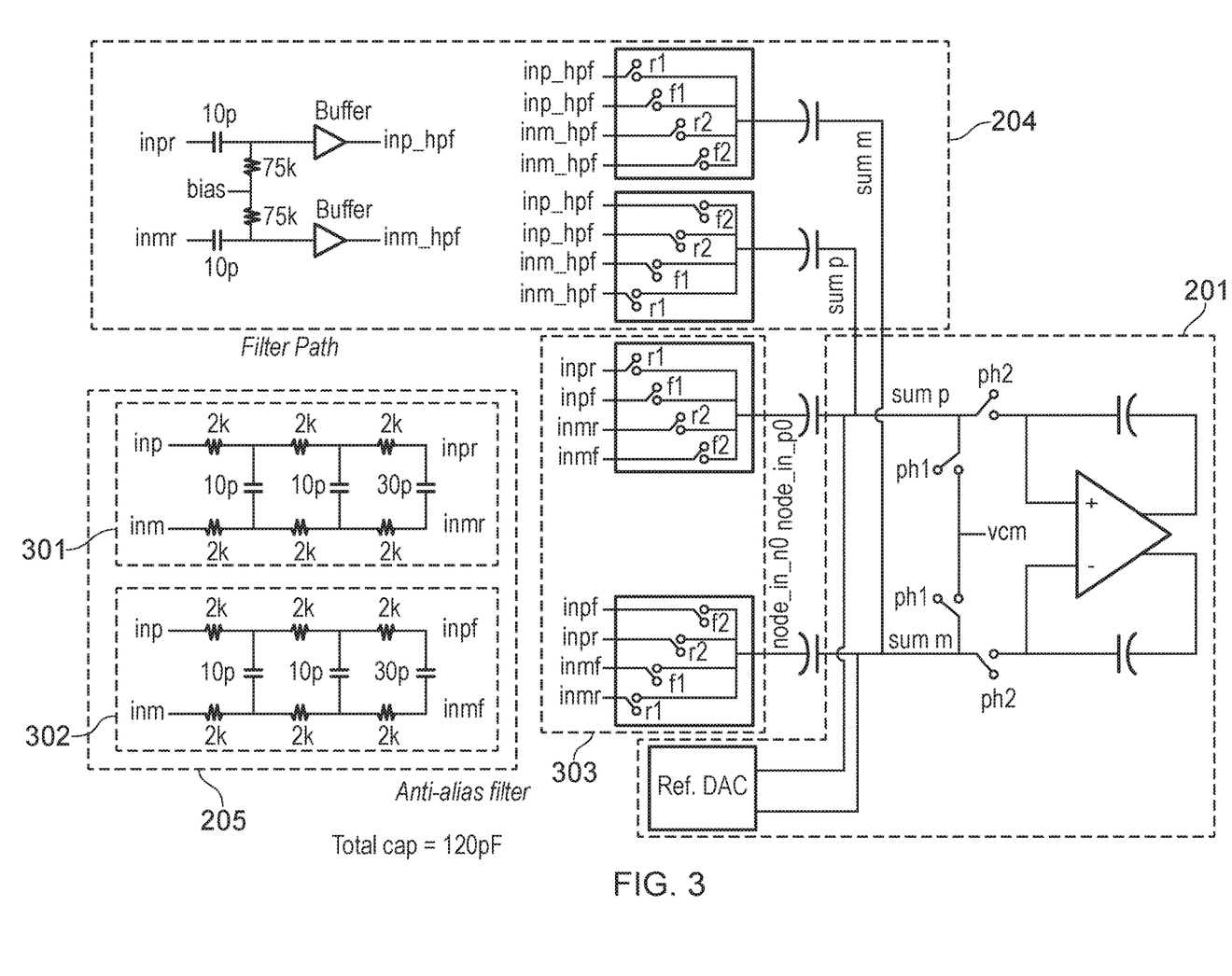
FIG. 3 illustrates an example implementation of an analog conditioning circuit in accordance with embodiments of the present disclosure.

FIG. 3 illustrates an example implementation of an analog conditioning circuit according to some embodiments of the invention. In this example, the analog conditioning circuit is providing the conditioned analog signal $A_C$ for input into a double sampled ADC.

In this example, the second filtering block 205 comprises a first filter 301 and a second filter 302. Both the first filter 301 and the second filter 302 comprise passive low pass filters configured to receive the analog input signal $A_{In}$. The analog input signal $A_{In}$ comprises a positive input voltage inp and a negative input voltage inm. In this example, the first filter 301 is configured to attenuate undesired frequencies of the analog input signal $A_{In}$ to generate the first signal $A_1$, and the second filter 302 is configured to attenuate undesired frequencies of the analog input signal $A_{In}$ to generate a third signal $A_3$. In this example, the first signal $A_1$ is the voltage between the positive voltage inpr and negative voltage inmr. In this example, the third signal $A_3$ comprises the voltage between the positive voltage inpf and negative voltage inmf.

The analog conditioning circuit, in this example, then further comprises a sampling block 303 configured to a sample the first signal $A_1$ and the third signal $A_3$ to generate the second signal $A_2$. For example, as the analog processing circuit 202 comprises a double sampled ADC, the sampling block 303 may be configured to sample the first signal $A_1$ during a rough charging phase of the double sampled ADC and the third signal $A_3$ during a fine charging phase of the double sampled ADC.

In this example, the first filtering block 204 comprises an active high pass filter. The output of the first filtering block 204 may comprise the filtered analog signal $A_F$ as described with reference to FIG. 2. The first filtering block 204 is in this example configured to receive the first signal $A_1$ as an input. However, it will be appreciated that in some examples, the first filtering block 204 may receive the second signal $A_2$ or the third signal $A_3$ as an input.

In this example, in order to subtract the filtered analog signal $A_F$ from the second signal $A_2$, the polarity of the filtered analog signal $A_F$ is reversed before it is inserted into the main signal path.

In some examples, the first filter 301 and the second filter 302 are the same, as illustrated in FIG. 3 in which both filters comprise third ($3^{rd}$) order low pass filters, however, in some examples, the first filter 301 and the second filter 302 may be different. For example, the first filter 301 may comprise a rough first order filter, and the second filter 302 may comprise a fine $n^{th}$ order filter where n is an integer greater than 1.

However, in a situation where the first filter 301 and second filter 302 are different, the response of the first filter 301 and second filter 302 may also be different. In these circumstances, an input signal around the sampling frequency may result in a smaller attenuation from the rough filter compared to the attenuation provided by the fine filter, and a resistor may essentially be set up between the sampling capacitors. Increasing the resistance and capacitance in the main signal path enough to have the first filter 301 and second filter 302 be the same, as illustrated in FIG. 3, may therefore improve the performance around the sampling frequency of the second filtering block 205.

Figure 4:
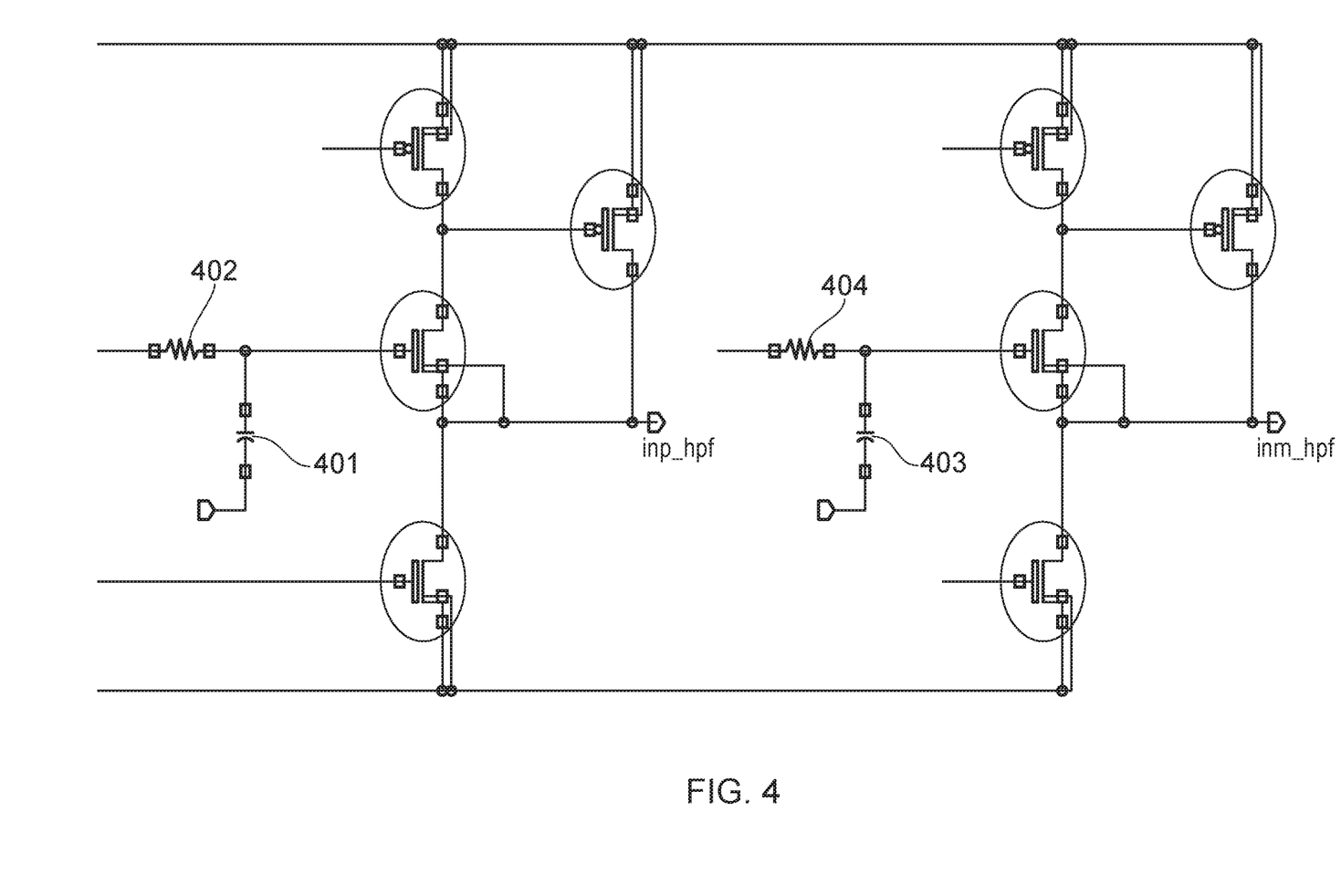
FIG. 4 illustrates an example implementation of the first filtering block in accordance with embodiments of the present disclosure.

FIG. 4 illustrates an example implementation of an active high pass filter, which may for example form part of first filtering block 204.

In this example, the output of the first filter 301, inpr and inmr, is used as an input to the active high pass filter. The positive voltage inpr is connected to a passive high pass RC filter circuit comprising a first capacitor 401 and a first resistance 402. The negative voltage inmr is also connected to a passive high pass filter circuit comprising a second capacitor 403 and a second resistance 404. The outputs of these passive high pass RC filter circuits are used as an input to a non-inverting super source follower buffer stage which outputs the positive output inp_hpf and negative output inm_hpf.

As illustrated in FIG. 3, the positive output inp_hpf and negative output inm_hpf of the active high pass filter may be used for both the rough and fine phases of the double sampling ADC. The reversal of the polarity of these signals, in this example, implements the subtraction of the output of the first filtering block 204 from output of the rough and fine phase sampling block 303. However, it will be appreciated that the output of the first filtering block 204 may be subtracted from the second signal $A_2$ in any suitable manner.

Figure 5A:
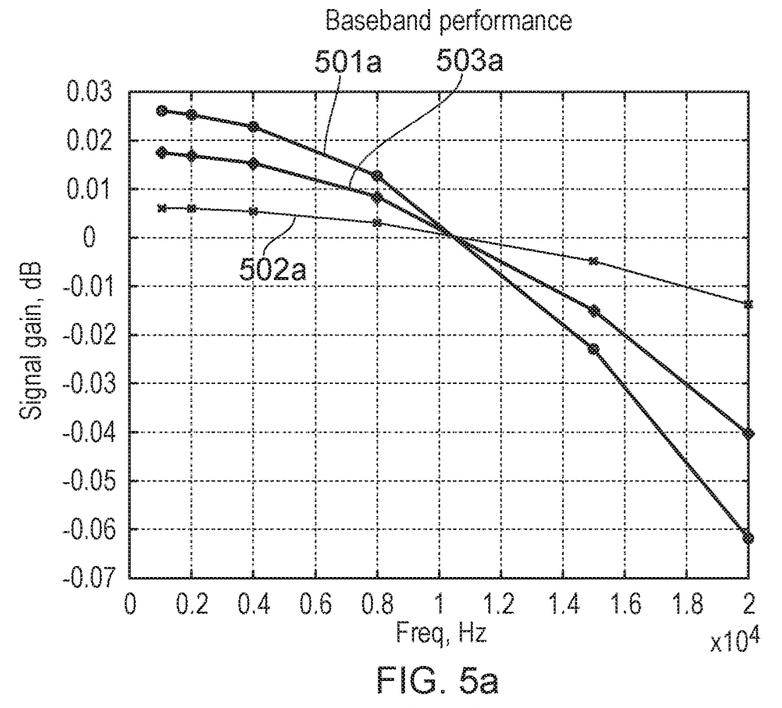
FIG. 5a is a graph of the anti-aliasing performance of different filtering implementations at baseband frequencies.

FIG. 5a illustrates a graph of the baseband performance, for example between 0 and $2 \times 10^4$ Hz, of different filtering implementations. In this example, the sampling frequency of the double sampled ADC is 6 MHz.

The baseband anti-aliasing performance of a first filtering implementation is represented by line 501a. In this first filtering implementation, there is no feedforward path and the rough and fine filters in the main signal path are unequal.

The baseband anti-aliasing performance of a second filtering implementation is represented by line 502a. In this second filtering implementation, there is no feedforward path, but the rough and fine filters in the main signal path are equal. As can be seen from the lines 501a and 502a, the first filtering implementation produces more attenuation between 1000 Hz and 2000 Hz, than the second filtering implementation.

The baseband anti-aliasing performance of a third filtering implementation is represented by line 503a. In this third filtering implementation, the feedforward path illustrated in FIG. 3 is implemented, with the rough and fine filters in the main signal path being equal.

In this third filtering implementation, the attenuation between 1000 Hz and 2000 Hz is slightly greater than the second implementation.

Figure 5B:
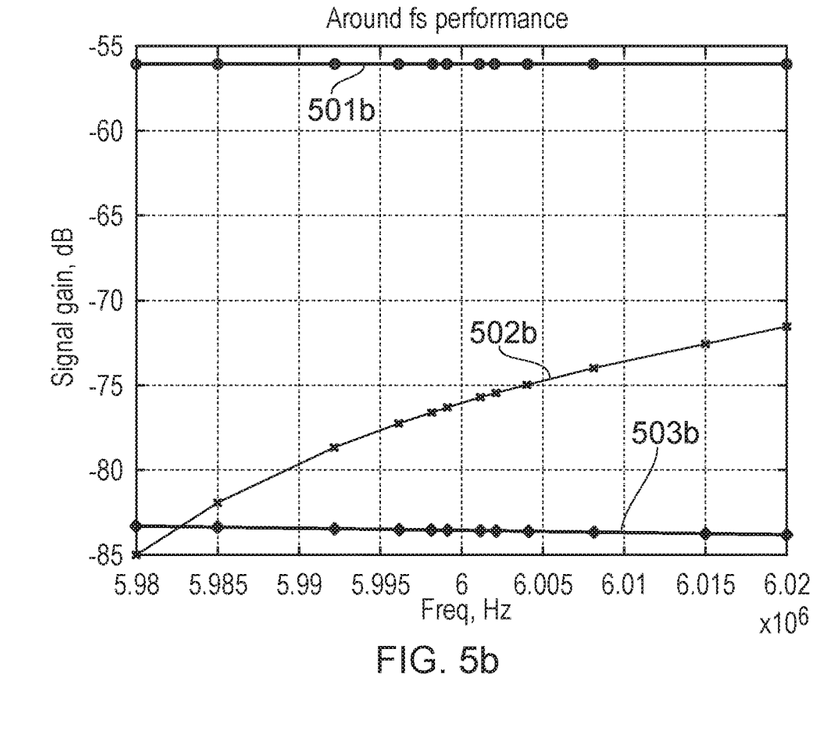
FIG. 5b is a graph of the anti-aliasing performance of different filtering implementations at frequencies around the sampling frequency.

FIG. 5b illustrates the performance around the sampling frequency of the three implementations described above with reference to FIG. 5a. In this example, the sampling frequency of the double sampled ADC is 6 MHz.

The anti-aliasing performance of the first filtering implementation is represented by line 501b. The attenuation provided by this first filtering implementation is therefore approximately 56 dB around the sampling frequency.

The anti-aliasing performance of the second filtering implementation is represented by line 502b. The attenuation provided by this second filtering implementation is therefore >70 dB around the sampling frequency. The double sampling zero in this second filtering implementation is slightly offset as the clocks used do not have an exact 50% duty cycle.

The anti-aliasing performance of the third filtering implementation is represented by the line 503b. The attenuation provided by the third filtering implementation is therefore approximately 83 dB around the sampling frequency. This attenuation of the second filtering implementation is therefore a 13 dB improvement over the attenuation of the first filtering implementation for the same capacitance in the main signal path at the sampling frequency.

Figure 5C:
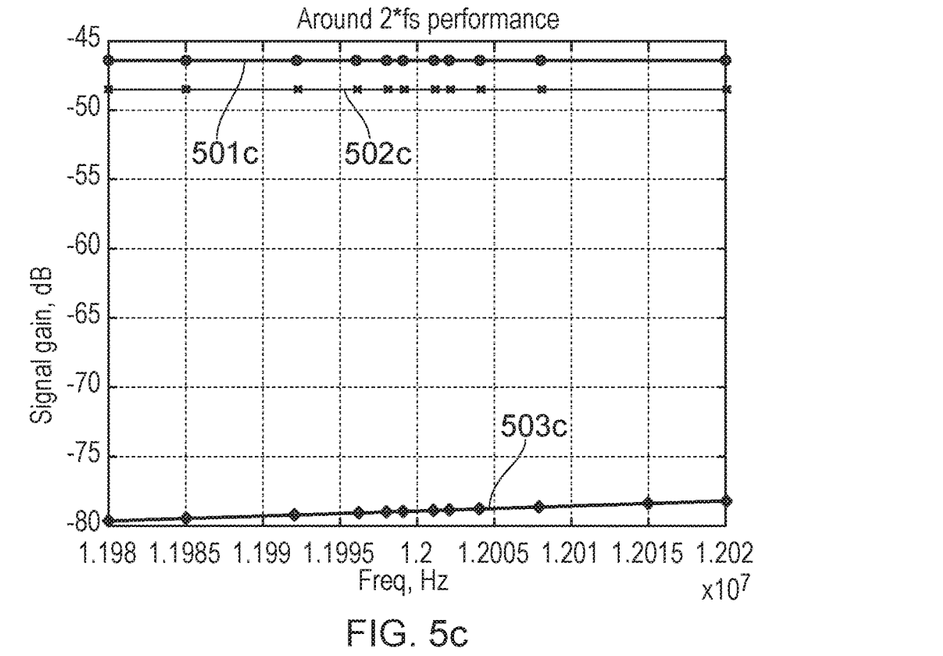
FIG. 5c is a graph of the anti-aliasing performance of different filtering implementations at frequencies around twice the sampling frequency.

FIG. 5c illustrates performance around twice the sampling frequency of the three filtering implementations described above with reference to FIG. 5a. In this example, the sampling frequency of the double sampled ADC is 6 MHz.

The anti-aliasing performance of the first filtering implementation is represented by line 501c. The attenuation provided by this first filtering implementation is therefore approximately 46 dB around twice the sampling frequency.

The anti-aliasing performance of the second filtering implementation is represented by line 502c. The attenuation provided by this second filtering implementation is therefore approximately 48 dB around twice the sampling frequency.

The anti-aliasing performance of the third filtering implementation is represented by the line 503c. The attenuation provided by the third filtering implementation is therefore approximately 78 dB around twice the sampling frequency. This attenuation is therefore a 32 dB improvement over the attenuation of the first filtering implementation for same the capacitance in the main signal path at twice the sampling frequency Therefore, the introduction of the feedforward path as illustrated in FIGS. 2 to 4 improves the anti-aliasing performance. Furthermore, as the improvement has been obtained by processing undesired frequencies, the introduction of the feedforward path has a negligible THD impact, as illustrated in FIG. 6 since the feedforward path does not handle base-band signals.

Figure 6:
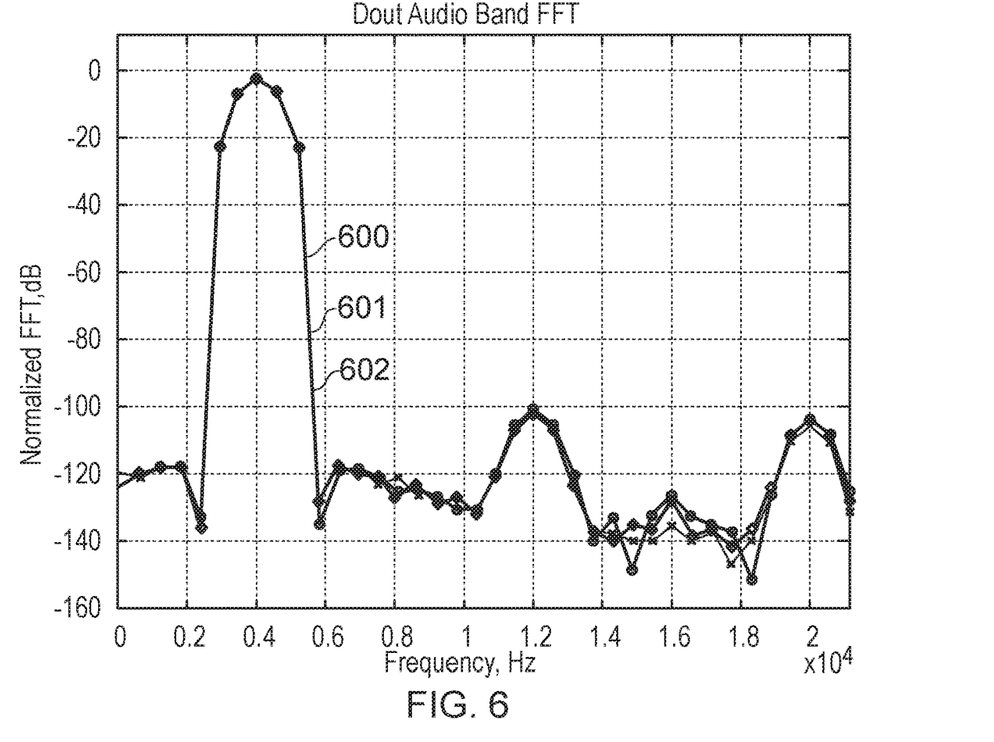
FIG. 6 illustrates the total harmonic distortion of different filtering implementations across base band frequencies.

FIG. 6 illustrates the THD of different filtering implementations across base band frequencies. In particular, the THD of the first filtering implementation 600, second filtering implementation 601 and third filtering implementation 602, are illustrated. As can be seen, the difference in THD between the three filtering implementations is minimal.

Figure 7:
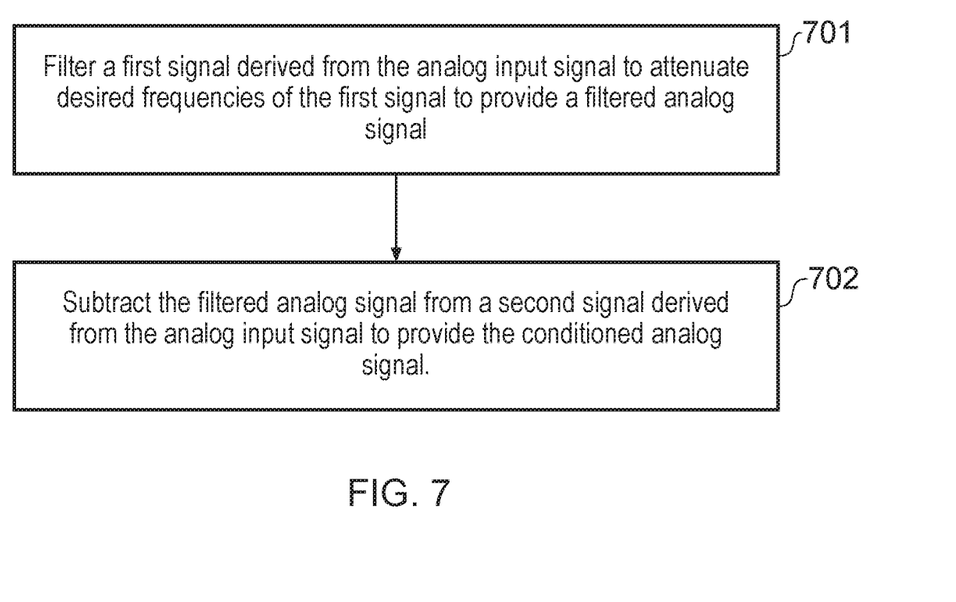
FIG. 7 is a flowchart illustrating a method for conditioning an analog input signal to provide a conditioned analog signal for input into an analog processing circuit in accordance with embodiments of the present disclosure.

FIG. 7 illustrates a method for conditioning an analog input signal to provide a conditioned analog signal for input into an analog processing circuit. It will be appreciated that the method described with respect to FIG. 7 may be performed by an analog conditioning circuit as described above. In some examples, the analog processing circuit comprises an ADC, for example a double sampled ADC.

In step 701, a first signal derived from the analog input signal is filtered to attenuate desired frequencies of the first signal to provide a filtered analog signal.

In step 702, the filtered analog signal is subtracted from a second signal derived from the analog input signal to provide the conditioned analog signal. A transfer function between the analog input signal and the conditioned analog signal is constrained by a transfer function requirement associated with the analog processing circuit.

In some examples, the method of FIG. 7 further comprises attenuating undesired frequencies of the analog input signal to provide the second signal.

In some examples, the method of FIG. 7 further comprises attenuating undesired frequencies of the analog input signal to generate the first signal; attenuating undesired frequencies of the analog input signal to generate a third signal; and sampling the first signal and the third signal to generate the second signal.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfill the functions of several units recited in the claims. Any reference numerals or labels in the claims shall not be construed so as to limit their scope. Terms such as amplify or gain include possible applying a scaling factor or less than unity to a signal.

It will of course be appreciated that various embodiments of the analog conditioning circuit as described above or various blocks or parts thereof may be co-integrated with other blocks or parts thereof or with other functions of a host device on an integrated circuit such as a Smart Codec.

The skilled person will thus recognize that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be understood that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems are not intended to be construed as critical, required, or essential feature or element.

Further embodiments likewise, with the benefit of this disclosure, will be apparent to those having ordinary skill in the art, and such embodiments should be deemed as being encompassed herein.

The invention claimed is:

1. An analog conditioning circuit comprising an anti-aliasing filter, wherein the analog conditioning circuit is configured to process an analog input signal to provide a conditioned analog signal for input into an analog processing circuit, the analog conditioning circuit comprising:
a main signal path between an input for receiving the analog input signal and an output for outputting the conditioned analog signal, wherein a transfer function of the main signal path is constrained by a transfer function requirement associated with the analog processing circuit; and
a feedforward signal path comprising a first filtering block configured to attenuate desired frequencies of a first signal derived from the analog input signal to provide a filtered analog signal; wherein
the feedforward signal path is configured to input the filtered analog signal into the main signal path such that the filtered analog signal is subtracted from a second signal derived from the analog input signal to provide the conditioned analog signal.

2. The analog conditioning circuit of claim 1, wherein the main signal path comprises a second filtering block configured to attenuate undesired frequencies of the analog input signal to provide the second signal.

3. The analog conditioning circuit of claim 2 wherein the second filtering block is constrained by the transfer function associated with the analog processing circuit.

4. The analog conditioning circuit of claim 2 wherein the second filtering block comprises:
a first filter configured to attenuate undesired frequencies of the analog input signal to generate the first signal;
a second filter configured to attenuate undesired frequencies of the analog input signal to generate a third signal; and
a sampling block configured to sample the first signal and the third signal to generate the second signal.

5. The analog conditioning circuit of claim 1 wherein the first signal and the second signal are the same.

6. The analog conditioning circuit of claim 1 wherein the analog processing circuit comprises an analog to digital converter (ADC).

7. The analog conditioning circuit of claim 6 wherein the ADC comprises a switched capacitor ADC.

8. The analog conditioning circuit of claim 1 wherein the first filtering block comprises a high pass filter.

9. The analog conditioning circuit of claim 8 wherein the high pass filter comprises an active high pass filter.

10. The analog conditioning circuit of claim 1 wherein the transfer function requirement comprises a requirement that the transfer function of the main signal path be approximately linear with respect to the analog input signal.

11. The analog conditioning circuit of claim 1 wherein the transfer function requirement comprises a requirement that the main signal path comprises a maximum resistance.

12. The analog conditioning circuit of claim 1 wherein the transfer function requirement comprises a requirement that the main signal path introduces a maximum total harmonic distortion (THD) level.

13. A method in an analog conditioning circuit comprising an anti-aliasing filter for conditioning an analog input signal to provide a conditioned analog signal for input into an analog processing circuit; the method comprising:
- filtering a first signal derived from the analog input signal to attenuate desired frequencies of the first signal to provide a filtered analog signal; and
- subtracting the filtered analog signal from a second signal derived from the analog input signal to provide the conditioned analog signal;
- wherein a transfer function between the analog input signal and the conditioned analog signal is constrained by a transfer function requirement associated with the analog processing circuit.

14. The method of claim 13, further comprising attenuating undesired frequencies of the analog input signal to provide the second signal.

15. The method of claim 14 further comprising:
- attenuating undesired frequencies of the analog input signal to generate the first signal;
- attenuating undesired frequencies of the analog input signal to generate a third signal; and
- sampling the first signal and the third signal to generate the second signal.

16. The method of claim 13 wherein the first signal and the second signal are the same.

17. The method of claim 13 wherein the analog processing circuit comprises an analog to digital converter (ADC).

18. The method of claim 17 wherein the ADC comprises a switched capacitor ADC.

19. An integrated circuit comprising:
- an analog conditioning circuit comprising an anti-aliasing filter, wherein the analog conditioning circuit is configured to process an analog input signal to provide a conditioned analog signal for input into an analog processing circuit, wherein the analog conditioning circuit comprises:
- a main signal path between an input for receiving the analog input signal and an output for outputting the conditioned analog signal, wherein the a transfer function of the main signal path is constrained by a transfer function requirement associated with the analog processing circuit; and
- a feedforward signal path comprising a first filtering block configured to attenuate desired frequencies of a first signal derived from the analog input signal to provide a filtered analog signal; wherein the feedforward signal path is configured to input the filtered analog signal into the main signal path such that the filtered analog signal is subtracted from a second signal derived from the analog input signal to provide the conditioned analog signal; and
- an analog processing circuit configured to receive the conditioned analog signal.

20. An electronic apparatus comprising an integrated circuit that has:
- an analog conditioning circuit as claimed in claim 1 configured to process an analog input signal to provide a conditioned analog signal for input into an analog processing circuit, wherein the analog conditioning circuit comprises:
- a main signal path between an input for receiving the analog input signal and an output for outputting the conditioned analog signal, wherein the a transfer function of the main signal path is constrained by a transfer function requirement associated with the analog processing circuit; and
- a feedforward signal path comprising a first filtering block configured to attenuate desired frequencies of a first signal derived from the analog input signal to provide a filtered analog signal; wherein the feedforward signal path is configured to input the filtered analog signal into the main signal path such that the filtered analog signal is subtracted from a second signal derived from the analog input signal to provide the conditioned analog signal; and
- an analog processing circuit configured to receive the conditioned analog signal.

21. The electronic apparatus of claim 20 wherein said apparatus is at least one of: a portable device; a battery power device; a computing device; a communications device; a gaming device; a mobile telephone; a personal media player; a laptop, tablet or notebook computing device.

* * * * *